(12) United States Patent
Lai et al.

(10) Patent No.: US 7,575,966 B2
(45) Date of Patent: Aug. 18, 2009

(54) METHOD FOR FABRICATING PIXEL STRUCTURE OF ACTIVE MATRIX ORGANIC LIGHT-EMITTING DIODE

(75) Inventors: Chih-Ming Lai, Changhua County (TW); Yung-Hui Yeh, Hsinchu (TW); Yi-Hsun Huang, Tainan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/254,820

(22) Filed: Oct. 20, 2008

(65) Prior Publication Data

US 2009/0068773 A1 Mar. 12, 2009

Related U.S. Application Data

(62) Division of application No. 11/308,015, filed on Mar. 3, 2006.

(30) Foreign Application Priority Data

Dec. 29, 2005 (TW) .............................. 94147154 A

(51) Int. Cl.
*H01L 21/00* (2006.01)
*H01L 21/84* (2006.01)
(52) U.S. Cl. .................. 438/153; 438/149; 438/48; 438/30; 257/72

(58) Field of Classification Search ............ 438/48, 438/30, 23, 149, 151, 153; 257/59, 72, E21.094, 257/E21.104, E21.372, E51.001, E51.052
See application file for complete search history.

(56) References Cited

U.S. PATENT DOCUMENTS 6,162,654 A * 12/2000 Kawabe ................... 438/30
7,202,096 B2 * 4/2007 Chen ....................... 438/29

* cited by examiner

*Primary Examiner*—Theresa T Doan
(74) *Attorney, Agent, or Firm*—Jianq Chyun IP Office

(57) ABSTRACT

A method for fabricating an AMOLED pixel includes forming a transparent semiconductor layer on a substrate and forming a first channel layer of the switch TFT, a lower electrode of a storage capacitor and a second channel layer of a driving TFT. A first dielectric layer is formed over the substrate. A first opaque metal gate of the switch TFT, a second opaque metal gate of the driving TFT and a scan line are formed on the first dielectric layer. A first source and a first drain of the switch TFT are formed in the first channel layer and a second source and a second drain of the switch TFT are formed in the second channel layer. A patterned transparent metal layer is formed on the first dielectric layer. A data line is formed over the substrate. An OLED is formed over the substrate.

8 Claims, 11 Drawing Sheets

METHOD FOR FABRICATING PIXEL STRUCTURE OF ACTIVE MATRIX ORGANIC LIGHT-EMITTING DIODE

CROSS-REFERENCE TO RELATED APPLICATION

This application is a divisional of an application Ser. No. 11/308,015, filed on Mar. 3, 2006, now pending, which claims the priority benefit of Taiwan application serial no. 94147154, filed on Dec. 29, 2005. The entirety of each of the above-mentioned patent applications is hereby incorporated by reference herein and made a part of this specification.

BACKGROUND OF THE INVENTION

1. Field of Invention

The present invention relates to an organic light-emitting diode (OLED) and the method for fabricating the same, and particularly to an active matrix organic light-emitting diode (AMOLED) and the method for fabricating the same.

2. Description of the Related Art

An organic light-emitting diode (OLED) is a semiconductor device capable of converting electrical energy into optical energy. Since OLEDs have advantages of high conversion efficiency, no angle of view (AOV) concern, simpler process, low cost, high response rates, broader operation temperature range and full colorization, OLEDs meet the requirements of multi-media age today and are broadly applied in indicator lights, luminance devices of display panels etc.

The earlier generation of OLED display is mainly driven by low-end passive matrix drive. However, the luminance efficiency and the lifetime of a passive driving device are largely declined along with the increase of display size and resolution. Instead, the active matrix OLED display (AMOLED display) featuring high brightness, low electricity-consumption and long lifetime plays an exceptional role in the current development of OLED displays.

An active matrix organic light-emitting diode (AMOLED) is a device using a thin film transistor (TFT) to drive a light emitting diode, wherein each pixel structure thereof includes an organic light-emitting diode (OLED), a switch TFT, a driving TFT, a storage capacitor, a scan line and a data line. The gray-level of an AMOLED pixel structure depends on the data line voltage. When a scan line turns on a switch TFT, the data line voltage drives the gate of the TFT via the switch TFT, so as to drive a required current to the OLED. Depending on a different voltage level, a corresponding different gray-level of display is produced. On the other hand, when the switch TFT is turned on, the storage capacitor begins with a charging action in order to store the input voltage. Therefore, after the switch TFT is turned off, the storage capacitor still remains the input voltage until the next time to turn on the switch TFT. In this way, the driving TFT remains on-state, so that the OLED keeps the original display brightness.

In a typical bottom emitting AMOLED, to keep a required frame quality, the storage capacitor is designed with a sufficient capacitance, and therefore the electrodes of the storage capacitor need to have enough area. However, the electrodes of the storage capacitor and the TFT gate are fabricated by opaque materials, and only an aperture ratio of approximate 30% is given. Thus, when a color filter is integrated into an OLED panel, the luminance brightness of the pixel array of a bottom emitting AMOLED is obviously not as good as a top emitting AMOLED.

SUMMARY OF THE INVENTION

The present invention is to provide a pixel structure of an active matrix organic light-emitting diode (AMOLED) and the method for fabricating the same, capable of improving the pixel aperture ratio.

The present invention is to provide a pixel structure of an active matrix organic light-emitting diode (AMOLED) and the method for fabricating the same, having sufficient luminance brightness.

The present invention provides a pixel structure of an active matrix organic light-emitting diode (AMOLED). The pixel structure includes an OLED, a data line, at least one scan line, at least one switch TFT, at least one driving TFT and at least one storage capacitor. The switch TFT has a first gate, a first source and a first drain, wherein the first gate is coupled to the scan line and the first source is coupled to the data line. The driving TFT has a second gate, a second source and a second drain, wherein the second gate is coupled to the first drain and the second drain is coupled to the OLED. The storage capacitor has a first transparent electrode, a second transparent electrode and a dielectric layer, wherein the first transparent electrode is electrically connected to the first drain and the second gate.

According to the embodiment of the present invention, the first transparent electrode of the storage capacitor is a transparent semiconductor layer, while the second transparent electrode is a transparent metal layer. The material of the transparent metal includes indium-tin-oxide (ITO) or indium zinc oxide (IZO). The material of the transparent semiconductor includes ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that can be univalent or (b) Ni; or indium gallium zinc oxide (InGaZnO). In addition, the area of the storage capacitor can be 50%~95% of a pixel area.

According to the embodiment of the present invention, the first gate of the switch TFT and the second gate of the driving TFT can be formed by an opaque metal layer, respectively, or by a transparent metal layer and an opaque metal layer, wherein the resistance of the opaque metal layer is smaller than that of the transparent metal layer.

According to the embodiment of the present invention, the first source and the first drain of the switch TFT and the second source and the second drain of the driving TFT are formed in a channel layer, respectively. The material of the channel layer is opaque doped semiconductor or transparent doped semiconductor.

According to the embodiment of the present invention, when the organic light-emitting layer of the OLED is made of white organic light-emitting material, the pixel structure thereof further includes a color filter disposed between the transparent substrate and the OLED. In addition, another color filter can be further included so that the OLED is between two color filters.

The present invention further provides a storage capacitor of the OLED pixel structure, and the capacitor includes a first transparent electrode, a second transparent electrode and a dielectric layer. The first transparent electrode is electrically connected to a drain of a switch TFT of the pixel and a gate of a driving TFT of the pixel.

According to the embodiment of the present invention, the first transparent electrode is a transparent semiconductor layer, while the second transparent electrode is a transparent metal layer. The material of the transparent metal includes indium-tin-oxide (ITO) or indium zinc oxide (IZO). The material of the transparent semiconductor includes ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that can be univalent or (b) Ni; or indium gallium zinc oxide (InGaZnO). In addition, the area of the storage capacitor can be 50%~95% of a pixel area.

The present invention also provides a method for fabricating a AMOLED pixel. First, a transparent semiconductor layer is formed on a substrate. By patterning the transparent semiconductor layer, a first channel layer of the switch TFT, a lower electrode of a storage capacitor and a second channel layer of a driving TFT are formed, wherein the lower electrode area of the storage capacitor is 50%~95% of the pixel area. Next, a first dielectric layer is formed over the substrate and the dielectric layer serves as a first gate dielectric layer, a dielectric layer of the storage capacitor and a second gate dielectric layer of the driving TFT. A first opaque metal gate of the switch TFT, a second opaque metal gate of the driving TFT and a scan line are formed on the first dielectric layer. A first source and a first drain of the switch TFT are formed in the first channel layer and a second source and a second drain of the switch TFT are formed in the second channel layer. A patterned transparent metal layer is formed on the first dielectric layer and the patterned transparent metal layer serves as an upper electrode of the storage capacitor, wherein the area of the storage capacitor upper electrode is 50%~95% of a pixel area. Afterwards, a data line is formed over the substrate to connect to the first source of the switch TFT. Further, an OLED is formed over the substrate to electrically connect to the second drain of driving TFT.

According to the embodiment of the present invention, the material of the transparent semiconductor includes ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that can be univalent or (b) Ni; or indium gallium zinc oxide (InGaZnO). The material of the transparent metal includes indium-tin-oxide (ITO) or indium zinc oxide (IZO).

According to the embodiment of the present invention, the step of forming and patterning the transparent metal layer on the first dielectric layer is to form the upper electrode of the storage capacitor and simultaneously to form the first transparent metal gate of the switch TFT and the second transparent metal gate of the driving TFT. In addition, the step for forming and patterning the transparent metal layer can be performed prior to or after the step of forming the first opaque metal gate of the switch TFT, the second opaque metal gate of the driving TFT and the scan line.

According to the embodiment of the present invention, when an organic light-emitting layer of the OLED is made of white organic light-emitting material, a color filter is further formed over the substrate prior forming the data line and the OLED but after forming the upper electrode of the storage capacitor. Furthermore, after the step of forming the OLED, another color filter can be formed on the OLED.

Since the present invention takes two transparent electrodes to form a storage capacitor in the AMOLED pixel structure, the entire capacitor is transparent, which enables to largely increase the aperture ratio of a pixel and allows the capacitor area to be 50%~95% of a pixel area for improving the frame quality. On the other hand, since the capacitor area in a pixel area can reach 50%~95%, the frame quality will not be deteriorated even if the size of the pixel is shrunken. Thus, pixel size can be further minimized.

Note that the gate, the scan line and the data line of the pixel structure are made of low-resistance metal, which contributes to a shorter RC time delay. Hence, the present invention is applicable to fabricate an active matrix panel with high resolution.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1A:
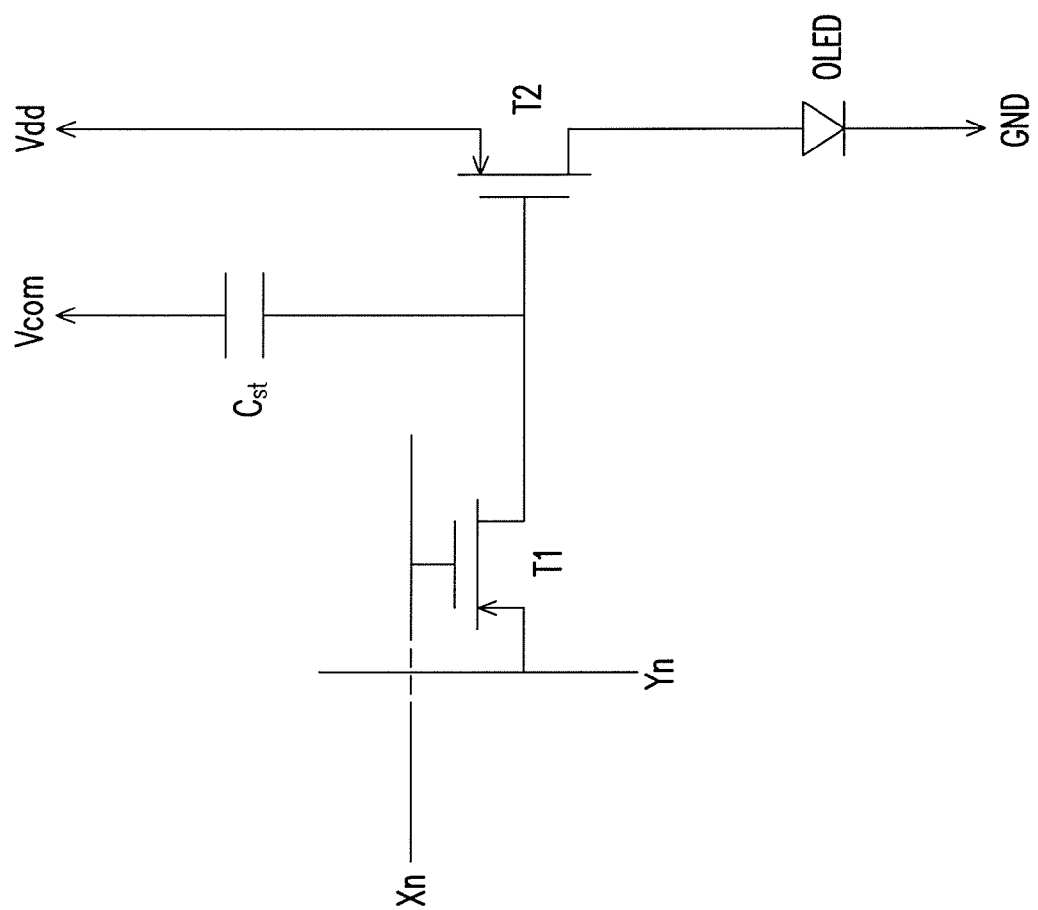
FIG. 1A is a schematic circuit drawing of an active matrix organic light-emitting diode (AMOLED) pixel structure.
Figure 1B:
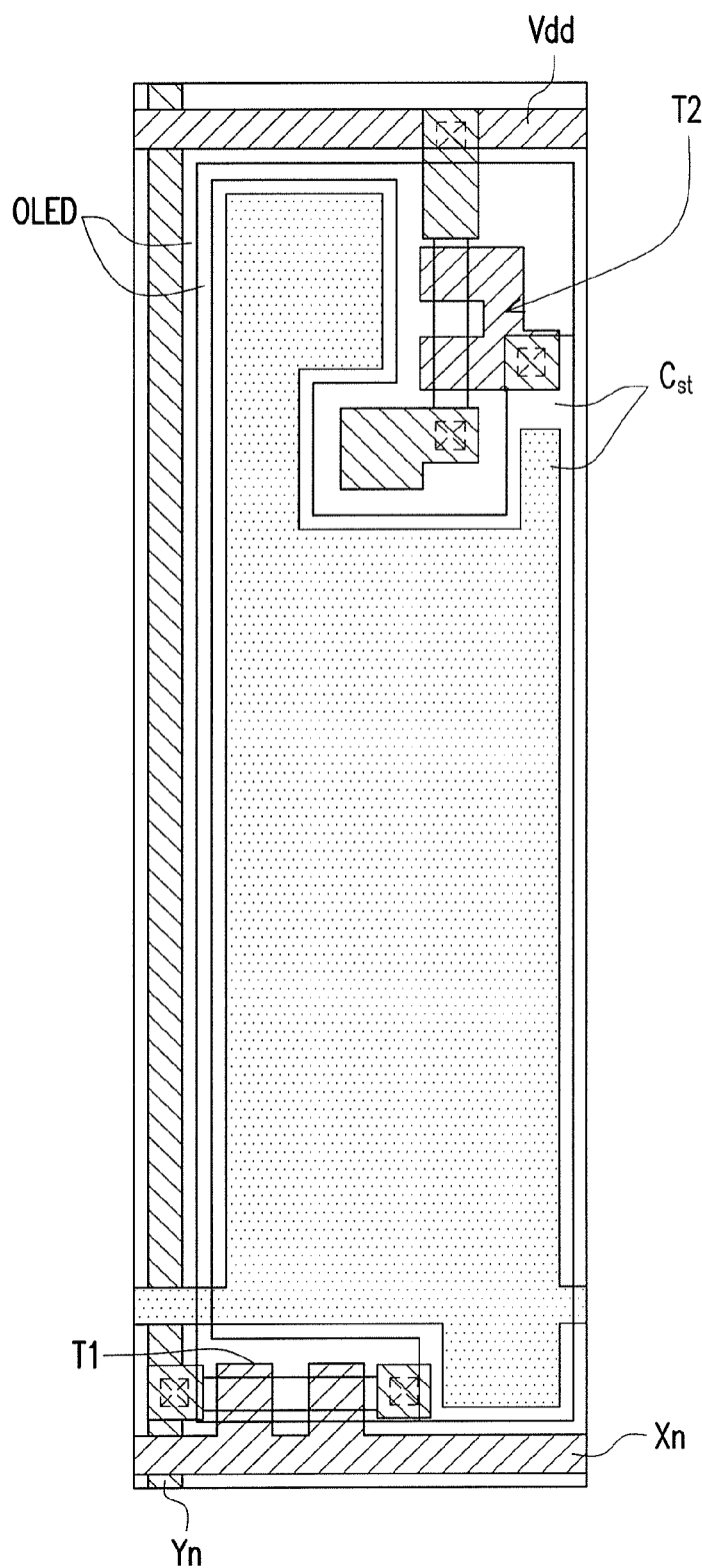
FIG. 1B is a schematic top view of an AMOLED pixel structure of the present invention.

FIG. 1A is a schematic circuit drawing of an active matrix organic light-emitting diode (AMOLED) pixel structure. Referring to FIG. 1A, an AMOLED is disposed on a transparent substrate and the pixel structure thereof includes an OLED, a data line Yn, a scan line Xn, a switch TFT T1, a driving TFT T2 and a storage capacitor $C_{st}$. The gate of the switch TFT T1 is coupled to the scan line Xn, while the source thereof is coupled to the data line Yn and the drain thereof is coupled to the gate of the driving TFT T2 and the storage capacitor $C_{st}$. The drain of the driving TFT T2 is coupled to the OLED, while the source thereof is coupled to a power line Vdd. The storage capacitor $C_{st}$ is formed by two transparent electrodes and a dielectric layer between the two electrodes. The lower electrode of the storage capacitor $C_{st}$ is electrically connected to the drain of the switch TFT T1 and the gate of the driving TFT T2 and is a transparent semiconductor layer. The material of the transparent semiconductor layer can be ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that can be univalent or (b) Ni; or indium gallium zinc oxide (InGaZnO). The upper electrode of the storage capacitor $C_{st}$ is electrically connected to a common line Vcom and is a transparent metal layer. The material of the transparent metal layer can be indium-tin-oxide (ITO) or indium zinc oxide (IZO). Since both electrodes of the storage capacitor $C_{st}$ are made of transparent material, thus, the whole storage capacitor $C_{st}$ is transparent and can be made of big area. The area thereof reaches 50%~95% of the whole pixel area, which leads an aperture ratio of storage capacitor $C_{st}$ to 50%~95% of a pixel area accordingly. In an embodiment, the layout of the components in a pixel structure is shown in FIG. 1B.

The gate of the switch TFT T1 and the gate of the driving TFT T2 can be formed either by opaque metal layers, or by a transparent metal layer and an opaque metal layer, wherein the resistance of the opaque metal layer is smaller than the resistance of the transparent metal layer. The layer contacting the gate dielectric layer of the switch TFT T1 or the gate dielectric layer of the driving TFT T2 can be either transparent metal layer or opaque metal layer. Furthermore, to select an appropriate opaque metal layer, the work function matching issue between the gate metal and the transparent semiconductor should be taken account of, so that the TFT possesses the optimum threshold voltage and the optimum transistor characteristic. The material of the opaque metal layer can be one of chromium (Cr), aluminum (Al), molybdenum (Mo) or titanium (Ti). The material of the transparent metal can be indium-tin-oxide (ITO) or indium zinc oxide (IZO). When the gate of the switch TFT T1 and the gate of the driving TFT T2 are formed by a transparent metal layer and an opaque metal layer, the transparent metal layer can be formed simultaneously with forming the transparent upper electrode of the storage capacitor $C_{st}$.

Both the source and the drain of the switch TFT T1 and the source and the drain of the driving TFT T2 can be made of opaque polysilicon. To simplify the process, the channel layer in the switch TFT T1 for forming the source and the drain thereof and the channel layer in the driving TFT T2 for forming the source and the drain thereof can be made of a same material as of the lower electrode of the storage capacitor $C_{st}$, which is a transparent semiconductor layer and can be ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that can be univalent or (b) Ni; or indium gallium zinc oxide (InGaZnO).

The organic light-emitting layer of the OLED can be made of a white organic light-emitting material. When the OLED is made of the white organic light-emitting material, a color filter can be disposed between the transparent substrate and the OLED for coloring images.

Since the present invention uses two transparent electrodes to form a storage capacitor in the AMOLED pixel structure and the entire capacitor area reaches 50%~95% of a pixel area, the scheme of the present invention can advance the frame quality and allows to further downsize the pixel without deteriorating the frame quality. Besides, such designed electrodes can be applicable to fabricate a two-side emitting OLED panel.

The AMOLED pixel structure of the present invention can be fabricated by the following method. However, the method described hereinafter is intended to be as an example only, and the present invention should not be limited by it.

Figure 2A:
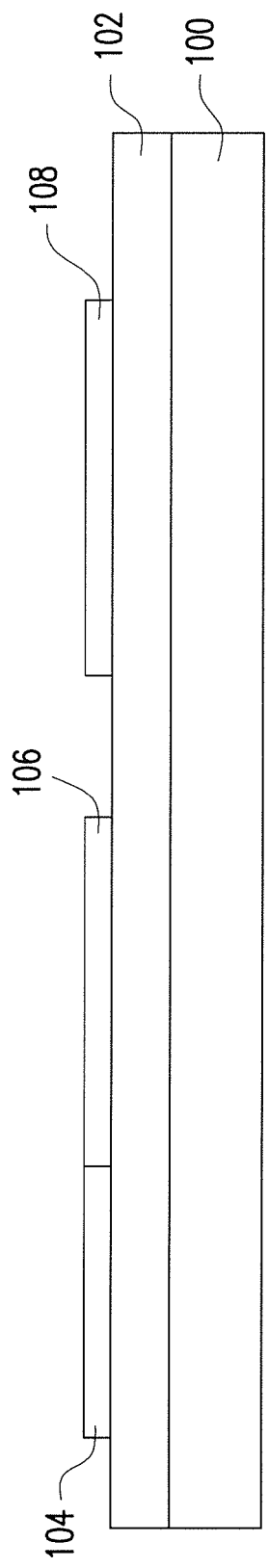
FIG. 2A to FIG. 2E are schematic cross-sectional drawings of an AMOLED pixel structure of the present invention.
Figure 2B:
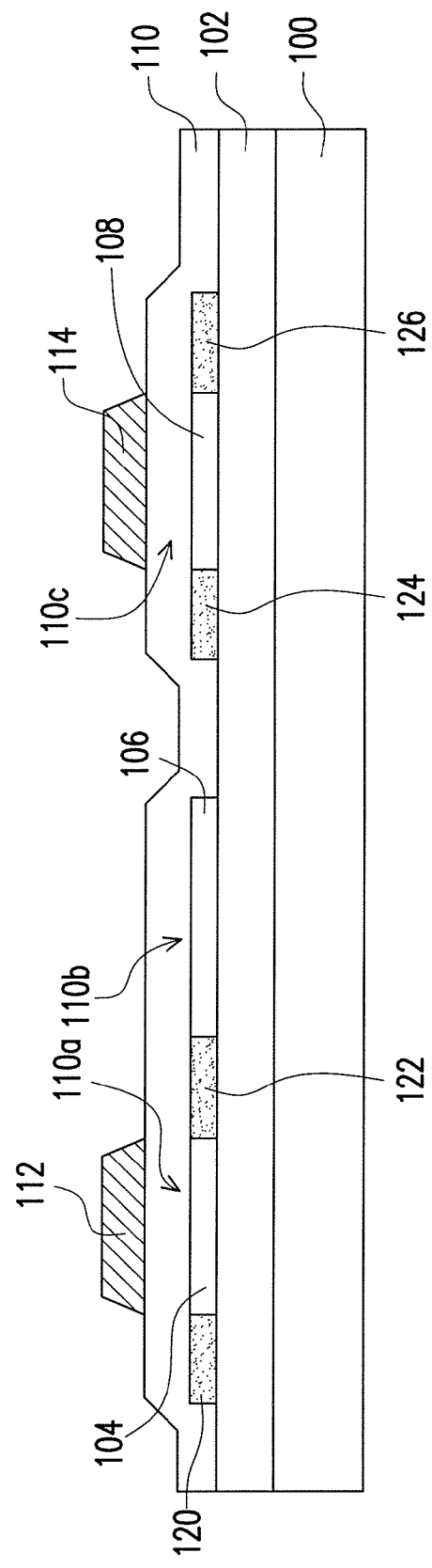
Figure 2C:
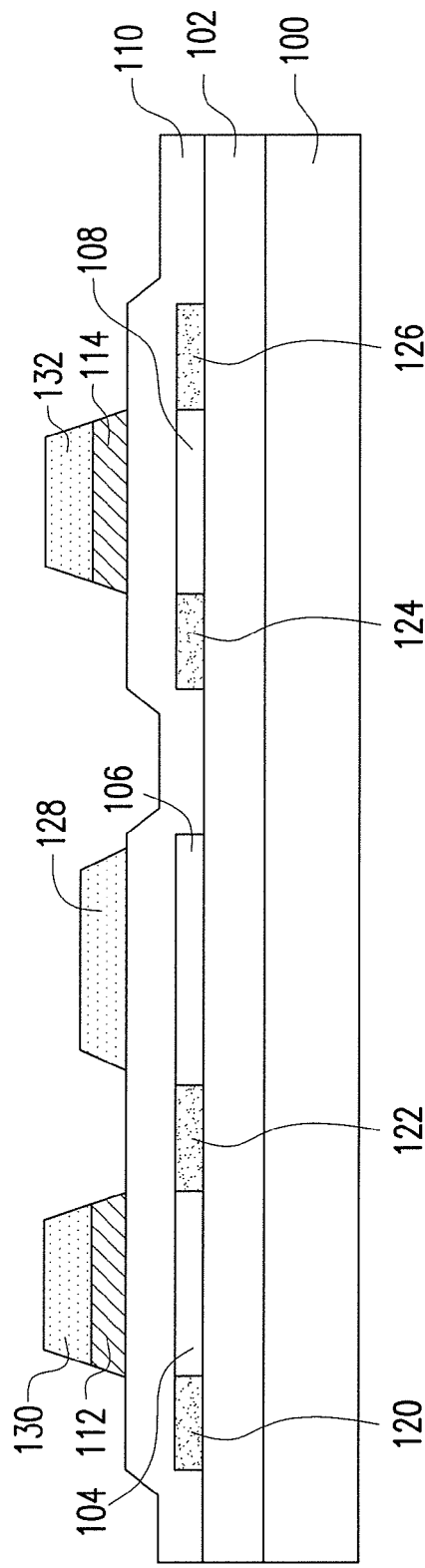
Figure 2C:
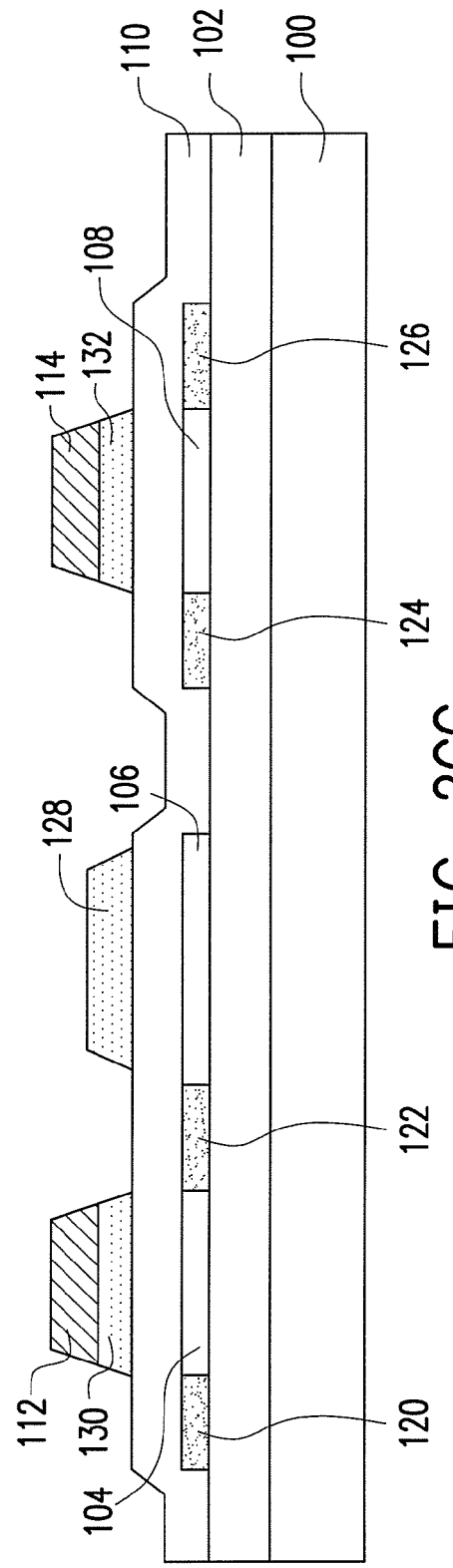
Figure 2D:
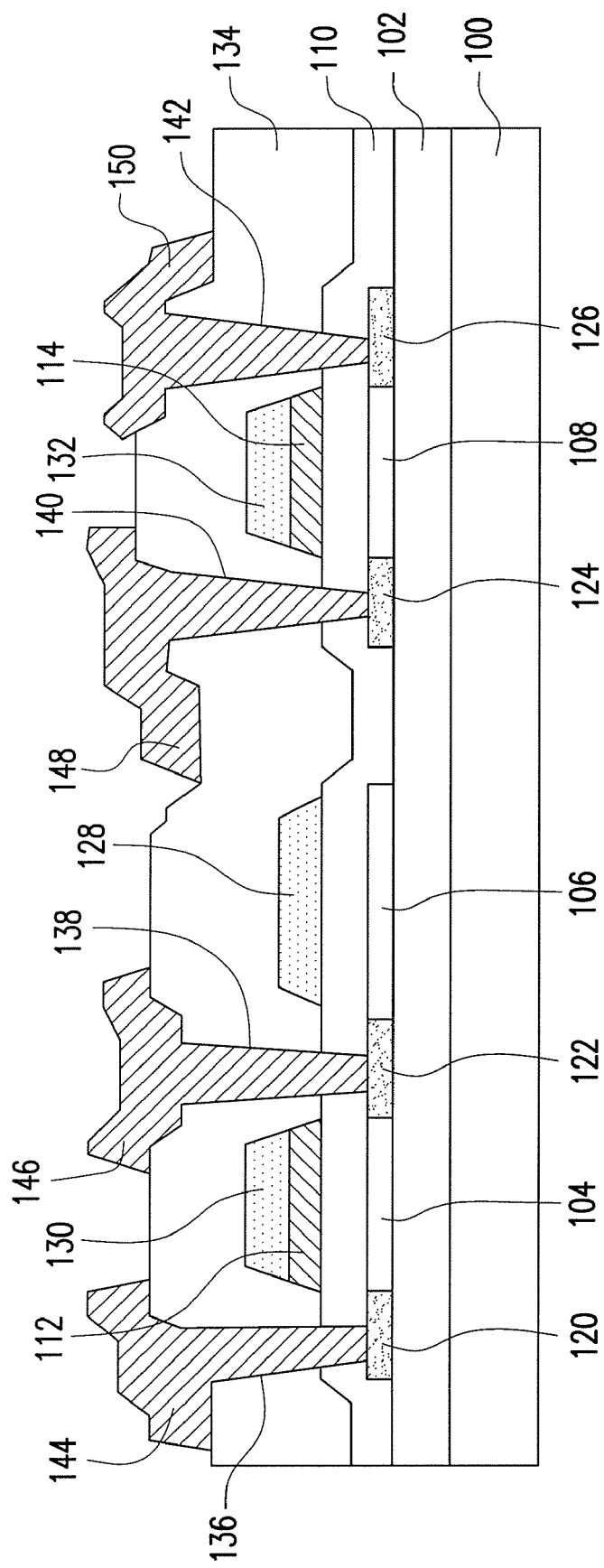
Figure 2E:
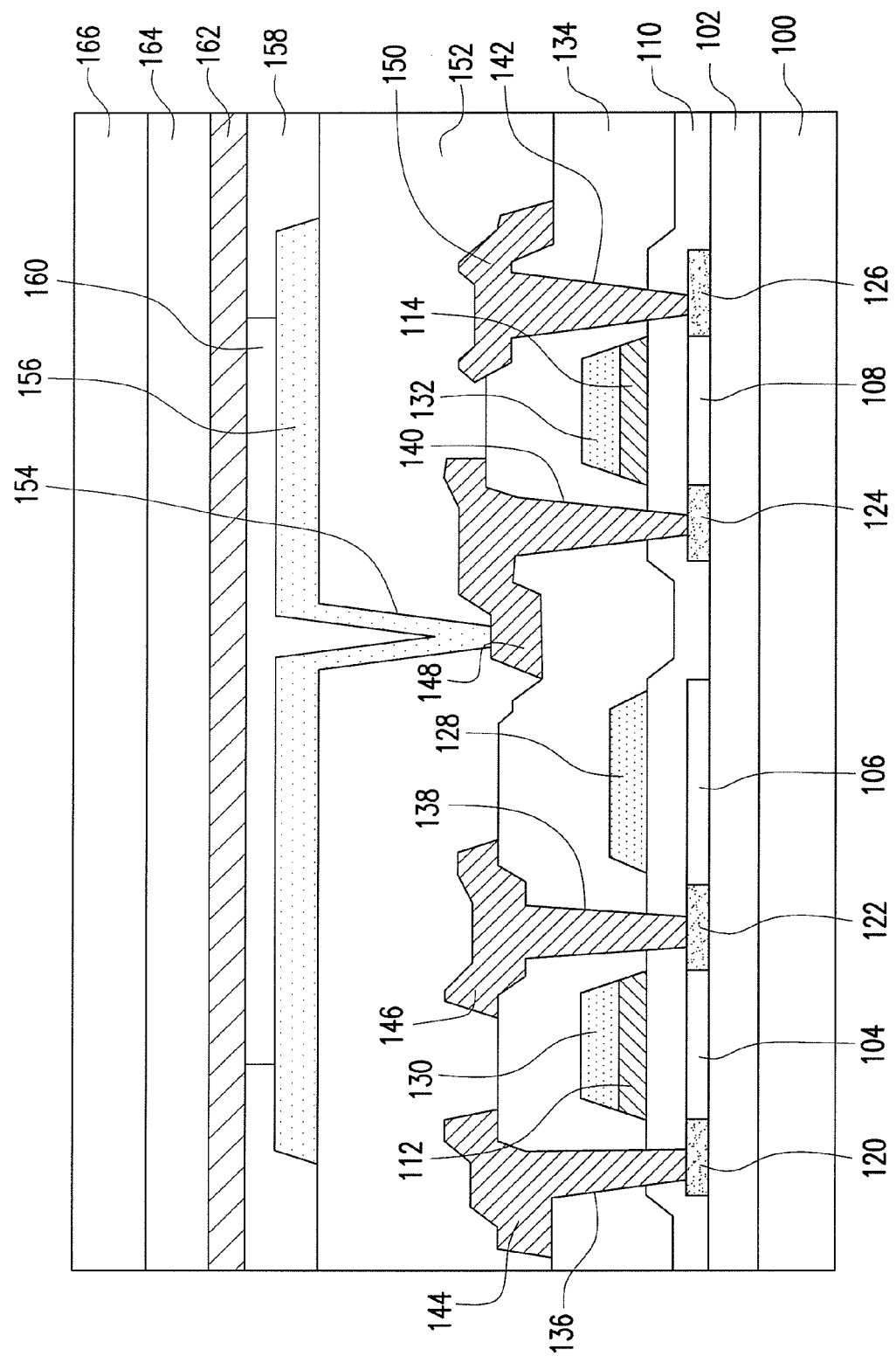
Figure 3A:
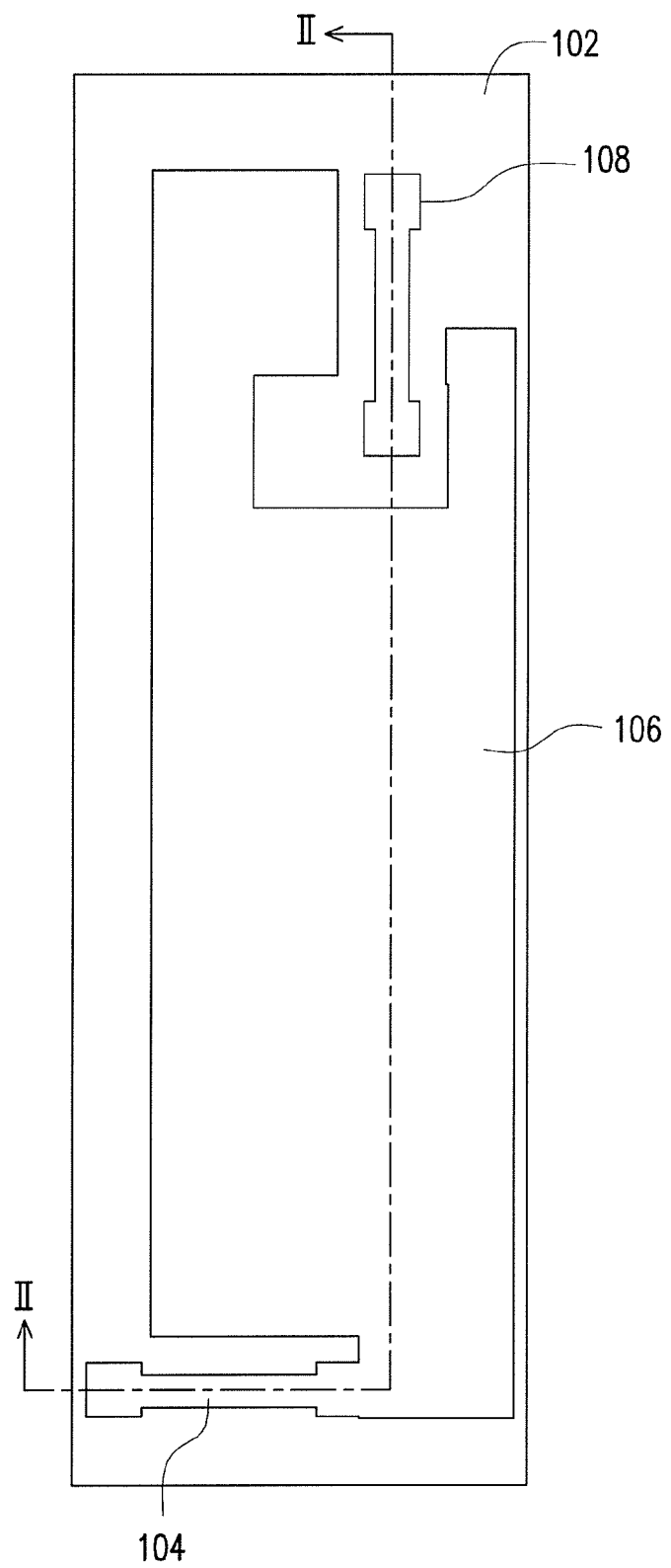
FIG. 3A to FIG. 3E are schematic top views of the AMOLED pixel structure of the present invention corresponding to FIG. 2A to FIG. 2E, respectively.

FIG. 2A to FIG. 2E are schematic cross-sectional drawings of an AMOLED pixel structure of the present invention and FIG. 3A to FIG. 3E are schematic top views of the AMOLED pixel structure of the present invention corresponding to FIG. 2A to FIG. 2E, respectively. Referring to FIG. 2A and FIG. 3A, first, a substrate 100 is provided and the substrate 100 is, for example, a glass substrate or a plastic substrate. Next, a buffer layer 102 is formed on the substrate 100, wherein the buffer layer 102 is an insulation layer and is, for example, a silicon oxide layer. Afterwards, a transparent semiconductor layer is formed on the buffer layer 102, followed by patterning the transparent semiconductor layer to form a channel layer 104 of the switch TFT, a lower electrode 106 of the storage capacitor and a channel layer 108 of the driving TFT. The material of the transparent semiconductor layer can be ZnO, $Mg_xZn_{1-x}O$, $Cd_xZn_{1-x}O$ or CdO, or ZnO, $Mg_xZn_{1-x}O$ $Cd_xZn_{1-x}O$ or CdO that have been doped with (a) an element that can be univalent or (b) Ni; or indium gallium zinc oxide (InGaZnO). In another embodiment, the transparent semiconductor layer is used for forming the lower electrode 106 of the storage capacitor only, while the channel layer 104 of the switch TFT and the channel layer 108 of the driving TFT can be formed by depositing and patterning an opaque semiconductor layer. The material of the opaque semiconductor layer is, for example, polysilicon. In another embodiment, the transparent semiconductor layer is used for forming the lower electrode 106 of the storage capacitor and one of the channel layer 104 of the switch TFT and the channel layer 108 of the driving TFT; and the rest one, either the channel layer 108 of the driving TFT or the channel layer 104 of the switch TFT can be formed by depositing and patterning an opaque semiconductor layer.

Figure 3B:
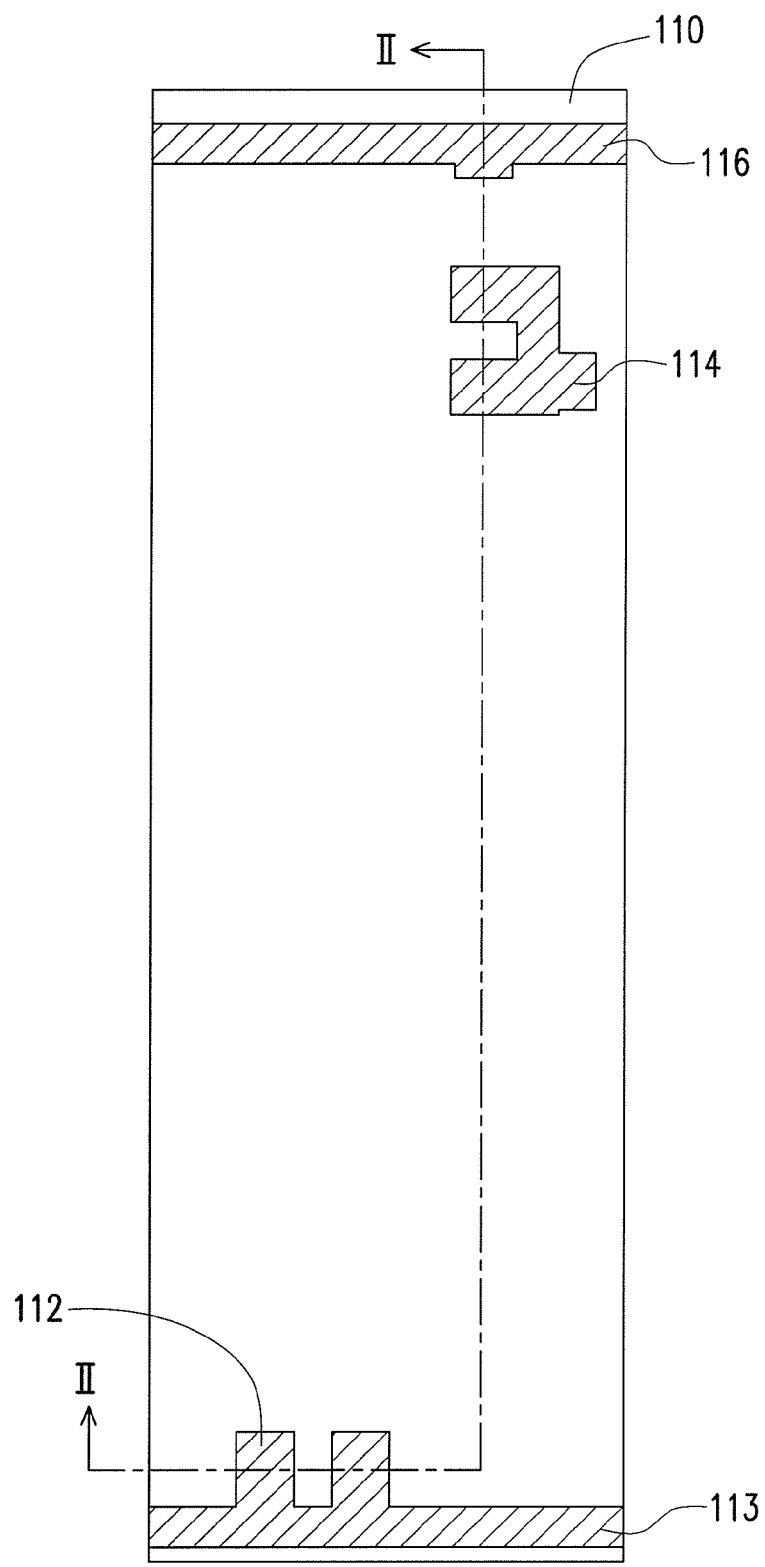

Further, referring to FIG. 2B and FIG. 3B, a dielectric layer 110 is formed over the substrate 100, which serves as a gate dielectric layer 110a of the switch TFT, a dielectric layer 110b of the storage capacitor and a gate dielectric layer 110c of the driving TFT. The material of the dielectric layer 110 is, for example, silicon oxide ($SiO_2$), tantalum oxide ($Ta_2O_5$), titanium oxide ($TiO_2$), yttrium oxide ($Y_2O_3$), calcium zirconium oxide ($CaZrO_3$) or indium gallium zinc oxide (InGaZnO). Furthermore, an opaque metal layer with low resistance is formed and patterned on the dielectric layer 110 to form an opaque metal gate 112 of the switch TFT, a scan line 113, an opaque metal gate 114 of the driving TFT and a power line 116. Subsequently, taking the opaque metal gate 112 of the switch TFT and the opaque metal gate 114 of the driving TFT as masks, an ion implanting process is performed to form a source 120 and a drain 122 of the switch TFT in the channel layer 104 and a source 124 and a drain 126 of the driving TFT in the channel layer 108, respectively.

Figure 3C:
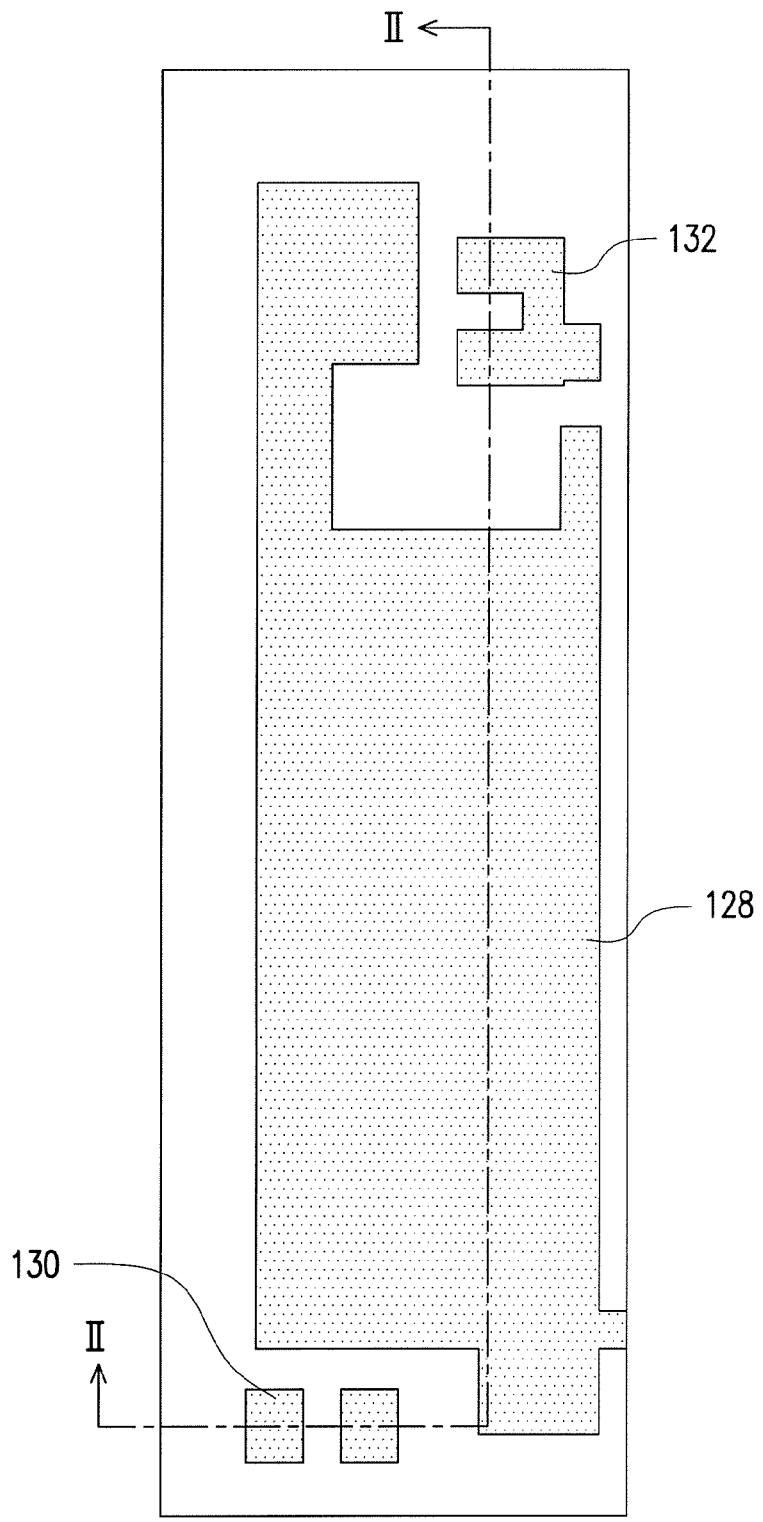

In succession, referring to FIG. 2C and FIG. 3C, a transparent metal layer is formed and patterned over the substrate 100 to form an upper electrode 128 of the storage capacitor, a transparent metal gate 130 of the switch TFT and a transparent metal gate 132 of the driving TFT. The transparent metal gate 130 of the switch TFT and the transparent metal gate 132 of the driving TFT can be a mono-gate structure (as shown in FIG. 2C) or a dual gate structure (as shown in FIG. 3C). In another embodiment, after patterning the transparent metal layer, only the upper electrode 128 of the storage capacitor is formed without forming the transparent metal gate 130 of the switch TFT and the transparent metal gate 132 of the driving TFT. In further another embodiment, after patterning the transparent metal layer, the upper electrode 128 of the storage capacitor and one of the transparent metal gate 130 of the switch TFT and the transparent metal gate 132 of the driving TFT are formed.

The characteristic of the above-described method is forming a patterned opaque metal layer first and then forming a patterned transparent metal layer. In another embodiment, however, the method can be forming a patterned transparent metal layer first and then forming a patterned opaque metal layer, which is shown in FIG. 2CC.

Figure 3D:
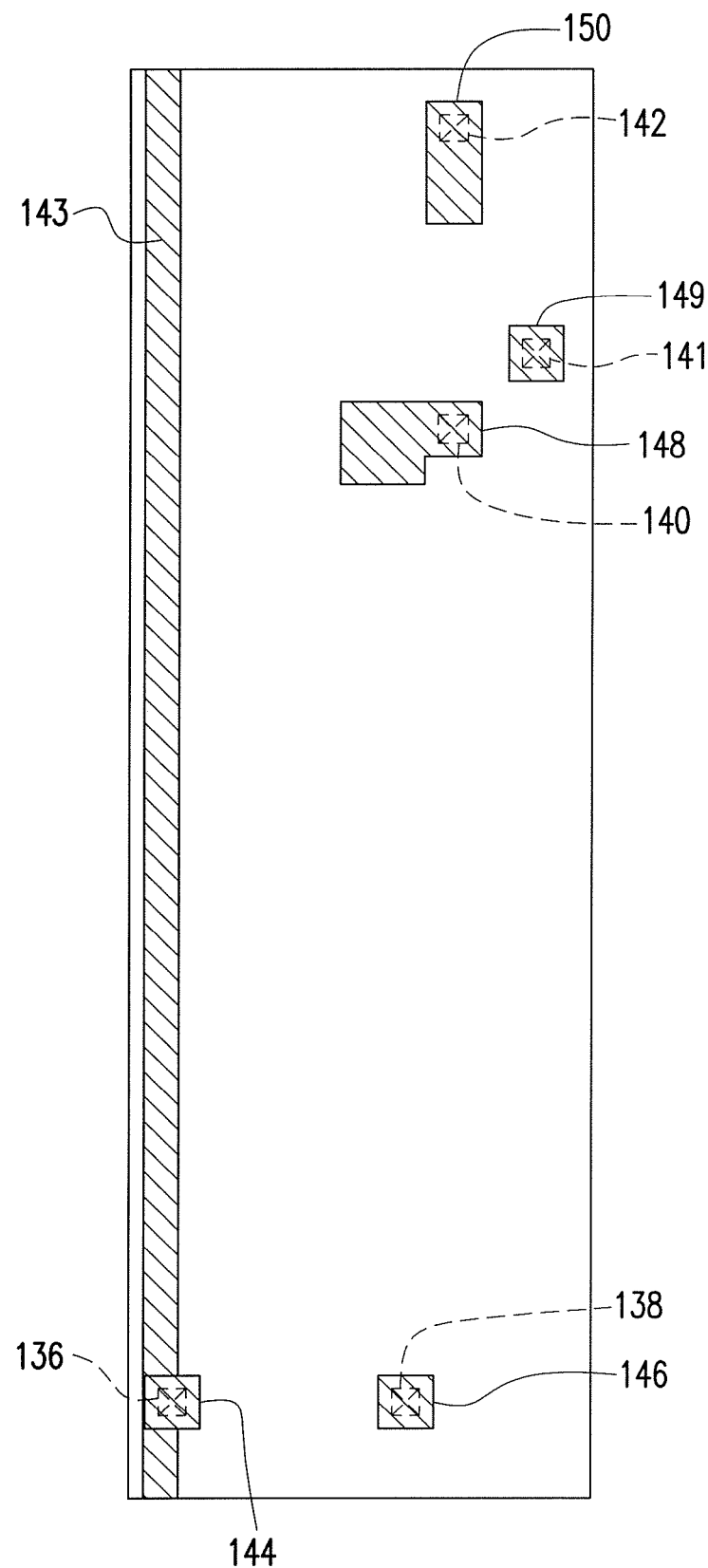

After that, referring to FIG. 2D and FIG. 3D, a dielectric layer 134 is formed over the substrate 100. The material of the dielectric layer 134 is, for example, silicon oxide. When the organic light-emitting layer of the OLED is made of a white organic light-emitting material, the dielectric layer 134 can be a color filter. Then, contact openings 136, 138, 140, 141 and 142 are formed in the dielectric layer 134. The contact openings 136, 138, 140, 141 and 142 expose the source 120 of the switch TFT, the drain 122 of the switch TFT, the source 124 of the driving TFT, the gate 114 or 132 of the driving TFT, the upper electrode 128 of the storage capacitor and the drain 126 of the driving TFT, sequentially. Then, an opaque metal layer is formed and patterned over the substrate 100 and in the contact openings 136, 138, 140, 141 and 142 to form contacts 144, 146, 148, 149, 150 and a scan line 143. The material of the opaque metal layer is, for example, titanium, tungsten, molybdenum tungsten alloy or aluminum.

Figure 3E:
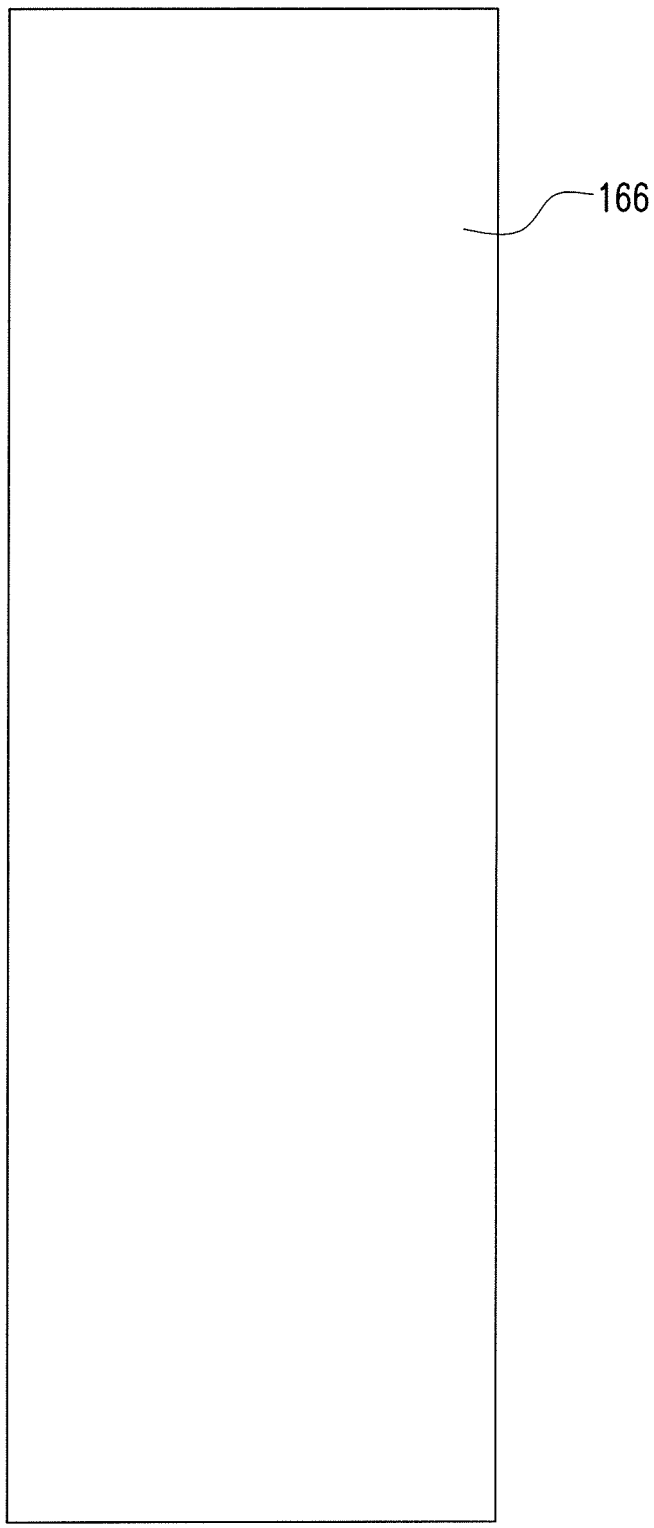

Referring to FIG. 2E and FIG. 3E, a protection layer 152 is formed to cover the substrate 100, and a contact opening 154 is formed in the protection layer 152 to expose the contact 148. Then, an anode layer 156 of the OLED is formed in the contact opening 154 and on the protection layer 152, wherein the anode layer 156 is electrically connected to the drain 124 of the driving TFT. The anode layer 156 is a transparent conductive material, for example, indium-tin-oxide (ITO) or indium zinc oxide (IZO). Then, another protection layer 158 is formed over the substrate 100, and an organic light-emitting layer 160 of the OLED is formed to cover the anode layer 156. Then, a cathode layer 162 of the OLED is formed on the organic light-emitting layer 160 to finally form an AMOLED. The material of the cathode layer 162 can be a transparent conductive material or an opaque conductive material. In an embodiment, the material of the cathode layer 162 is, for example, a metal, such as calcium or aluminum. Then, a cover plate 166 is formed on the cathode layer 162 to cover the cathode layer 162. The material of the cover plate 166 is, for example, transparent glass or transparent plastic. When the organic light-emitting layer 160 of the OLED is made of a white organic light-emitting material, a color filter 134 can be disposed between the transparent substrate 100 and the anode layer and another color filter 164 can be disposed between the cathode layer 162 and the cover plate 166 covering the surface of the cathode layer 162 to obtain light-emitting effects on both sides of the display panel.

Though a pixel structure comprised of a switch TFT, a driving TFT and a capacitor is disclosed hereinabove, however, the disclosed pixel structure does not limit the present invention. Any skilled in the art can make various modifications and variations to the structure of the present invention without departing from the scope or spirit of the invention. For example, the pixel layout of an AMOLED can be of a plurality of switch TFTs, a plurality of driving TFTs and a plurality of capacitors associated with a plurality of scan lines, which is still protected by a true scope and spirit of the invention being indicated by the following claims and their equivalents.

What is claimed is:

1. A method for fabricating a pixel of an active matrix organic light-emitting diode, comprising:

forming a patterned transparent semiconductor layer on a substrate to form at least one first channel layer of a switch thin film transistor, at least one lower electrode of a storage capacitor and at least one second channel layer of a driving thin film transistor, wherein the area of the storage capacitor lower electrode is about 50%~95% of the pixel area;

forming a first dielectric layer over the substrate to serve as a first gate dielectric layer of the switch thin film transistor, a dielectric layer of the storage capacitor and a second gate dielectric layer of the driving thin film transistor;

forming a first opaque metal gate of the switch thin film transistor, a second opaque metal gate of the driving thin film transistor and at least one scan line on the first dielectric layer;

forming a first source and a first drain of the switch thin film transistor in the first channel layer and forming a second source and a second drain of the driving thin film transistor in the second channel layer;

forming a patterned transparent metal layer on the first dielectric layer to serve as an upper electrode of the storage capacitor, wherein the area of the upper electrode is about 50%~95% of the pixel area;

forming a data line over the substrate electrically connected to the first source of the switch thin film transistor; and forming an organic light-emitting diode over the substrate electrically connected to the second drain of the driving thin film transistor.

2. The method for fabricating the pixel of the active matrix organic light-emitting diode of claim 1, wherein the material of the transparent semiconductor comprises ZnO, $Mg_xZn_{1-x}O$, $Cd_xZn_{1-x}O$ or CdO, or ZnO, $Mg_xZn_{1-x}O$, $Cd_xZn_{1-x}O$ or CdO that have been doped with (a) an element that is univalent or (b) Ni; or indium gallium zinc oxide (InGaZnO).

3. The method for fabricating the pixel of the active matrix organic light-emitting diode of claim 1, wherein the material of the transparent metal comprises indium tin oxide or indium zinc oxide.

4. The method for fabricating the pixel of the active matrix organic light-emitting diode of claim 1, wherein the step for forming the patterned transparent metal layer on the first dielectric layer includes forming the upper electrode of the storage capacitor, a first transparent metal gate of the switch thin film transistor and a second transparent metal gate of the driving thin film transistor.

5. The method for fabricating the pixel of the active matrix organic light-emitting diode of claim 4, wherein the step for forming the patterned transparent metal layer on the first dielectric layer is performed prior to the step for forming the first opaque metal gate of the switch thin film transistor, the second opaque metal gate of the driving thin film transistor and the scan line on the first dielectric layer.

6. The method for fabricating the pixel of the active matrix organic light-emitting diode of claim 4, wherein the step for forming the patterned transparent metal layer on the first dielectric layer is performed after the step for forming the first opaque metal gate of the switch thin film transistor, the second opaque metal gate of the driving thin film transistor and the scan line on the first dielectric layer.

7. The method for fabricating the pixel of the active matrix organic light-emitting diode of claim 1, wherein the organic light-emitting diode includes a white organic light-emitting layer and the step of the method further comprises forming a color filter on the substrate prior to forming the data line and the organic light-emitting diode but after forming the upper electrode of the storage capacitor.

8. The method for fabricating the pixel of the active matrix organic light-emitting diode of claim 7, further comprising a step for forming another color filter to cover the organic light-emitting diode after the step of forming the organic light-emitting diode.

* * * * *